(12) United States Patent
Cok et al.

(10) Patent No.: US 7,153,180 B2
(45) Date of Patent: Dec. 26, 2006

(54) CONTINUOUS MANUFACTURE OF FLAT PANEL LIGHT EMITTING DEVICES

(75) Inventors: Ronald S. Cok, Rochester, NY (US); David R. Strip, Albuquerque, NM (US); Robert F. Cournoyer, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 136 days.

(21) Appl. No.: 10/712,176

(22) Filed: Nov. 13, 2003

(65) Prior Publication Data

US 2005/0106986 A1  May 19, 2005

(51) Int. Cl.
*H01J 9/00* (2006.01)
*H01J 9/20* (2006.01)
*H01J 9/22* (2006.01)

(52) U.S. Cl. ............................. 445/58; 445/66; 445/67; 427/64; 427/66; 427/68

(58) Field of Classification Search ................... 445/58
See application file for complete search history.

(56) References Cited

U.S. PATENT DOCUMENTS

| | | | |
|---|---|---|---|
| 6,091,196 A * | 7/2000 | Codama ..................... 313/504 |
| 6,228,228 B1 | 5/2001 | Singh et al. .............. 204/192.1 |
| 6,328,806 B1 | 12/2001 | Eller ........................... 118/718 |
| 6,440,277 B1 * | 8/2002 | D'Amato ................ 204/192.15 |
| 6,579,422 B1 | 6/2003 | Kakinuma ............. 204/192.13 |
| 6,842,278 B1 * | 1/2005 | Sakamaki et al. ........... 359/296 |
| 2002/0179013 A1 | 12/2002 | Kido et al. .................. 118/718 |
| 2002/0196401 A1 * | 12/2002 | Grace et al. ................ 349/158 |
| 2003/0150384 A1 * | 8/2003 | Baude et al. ................ 118/721 |

FOREIGN PATENT DOCUMENTS

| EP | 1 115 268 | 7/2001 |
|---|---|---|
| JP | 2001-092388 | 4/2001 |

* cited by examiner

*Primary Examiner*—Mariceli Santiago
*Assistant Examiner*—Elizabeth Rielley
(74) *Attorney, Agent, or Firm*—Andrew J. Anderson; Thomas H. Close

(57) ABSTRACT

A method of applying patterned materials for manufacture of a flat panel light source includes providing a flexible continuous substrate; providing one or more application stations, each application station having, one or more stationary sources of material, a supply of discrete patterned masks for defining a pattern of material to be applied to the substrate, means for attaching the discrete patterned masks to the substrate; means for transporting the substrate and the patterned mask in registration past the one or more stationary sources of material, and means for delivering the masks one at a time to the transporting means; and transporting the substrate and the masks past the one or more application stations.

23 Claims, 6 Drawing Sheets

US 7,153,180 B2

CONTINUOUS MANUFACTURE OF FLAT PANEL LIGHT EMITTING DEVICES

FIELD OF THE INVENTION

The present invention relates to the manufacture of flat panel light emitting devices such as displays and extended light sources, an example being organic light emitting diode displays, backlights and area illumination sources and, more particularly, to the patterned deposition of materials such as organic light emitting materials on a substrate.

BACKGROUND OF THE INVENTION

Organic light emitting diode (OLED) light sources and displays are known. Such light sources and displays are constructed by depositing and treating multiple layers of materials such as organic materials on a substrate. When a current is passed through the multiple layers of organic materials, light is emitted. The color of light is dependent on the type of materials. As used herein the term flat panel light source refers to displays, backlights, and area illumination devices.

The deposition of the layers of organic materials in an OLED device is difficult. The materials are sensitive to moisture and must be carefully patterned at a high resolution to enable a pixilated display capable of, for example, displaying images. Small molecule OLED materials are typically deposited by evaporation from a source onto a substrate. It is known to register a mask having extended linear structures with variable widths with a substrate and to translate a source of material past the substrate to form a patterned deposition. This process is described in detail in "Linear Source Deposition of Organic Layers for Full Color OLED" by VanSlyke et al. SID 02 Digest, Vol. 33, No. 2, pp 886–889, 2002. However, this technique is not convenient for continuous manufacture.

U.S. Patent Application No. 2002/0179013A1, published Dec. 5, 2002 by Kido et al. discloses a vapor deposition system that includes a plurality of vapor deposition chambers through which discrete substrates and masks are passed to receive successive deposits of vapor deposition material. A problem with this approach is the complication of holding and transporting individual discrete substrates.

U.S. Pat. No. 6,328,806 issued Dec. 11, 2001 to Eller discloses a device for treating a band-shaped substrate with a gas. A continuous band-shaped substrate is passed by a deposition station that includes a source of gaseous material and a continuous band-shaped mask. A problem with this approach is the difficulty in making, handling, and cleaning a continuous mask through which multiple depositions are to be made, and the difficulty in maintaining alignment with a continuous substrate and continuous mask for multiple depositions. In addition, continuous masks are expensive to manufacture.

There is a need therefore for an improved continuous method for the application of patterned materials for making flat panel light sources.

SUMMARY OF THE INVENTION

The need is met according to the present invention by providing a method of applying patterned materials for manufacture of a flat panel light source that includes providing a flexible continuous substrate; providing one or more application stations, each application station having, one or more stationary sources of material, a supply of discrete patterned masks for defining a pattern of material to be applied to the substrate, means for attaching the discrete patterned masks to the substrate; means for transporting the substrate and the patterned mask in registration past the one or more stationary sources of material, and means for delivering the masks one at a time to the transporting means; and transporting the substrate and the masks past the one or more application stations.

ADVANTAGES

The present invention has the advantage that it provides a means for the continuous application of materials onto a substrate.

DETAILED DESCRIPTION OF THE INVENTION

Figure 1:
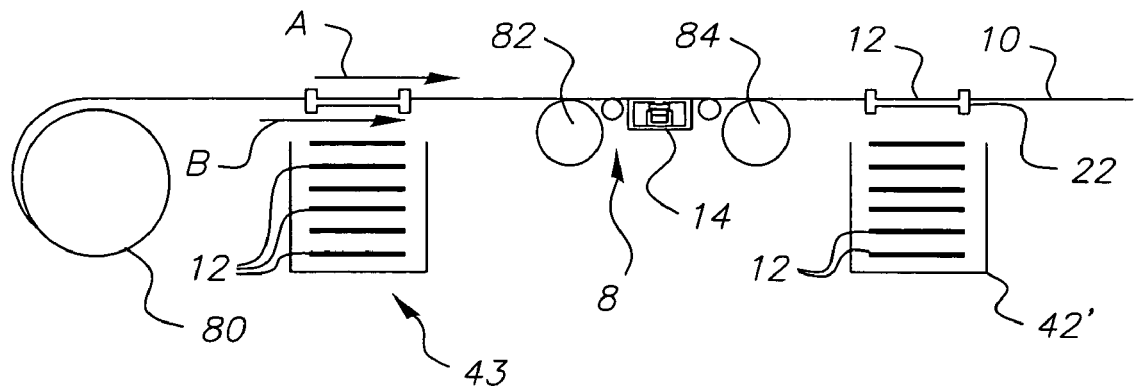
FIG. 1 is a schematic diagram of a method of depositing materials on a substrate according to the present invention.
Figure 2:
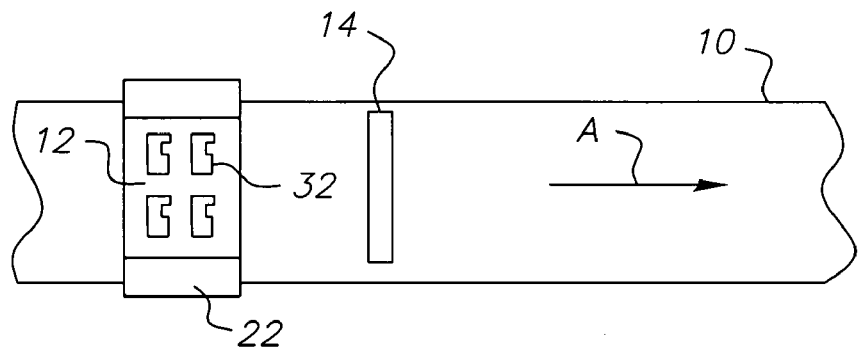
FIG. 2 is a schematic diagram showing a method of attaching a mask to a substrate using clamps.

Referring to FIGS. 1 and 2, a method of applying patterned materials for manufacture of a flat panel display, includes providing a continuous flexible display substrate 10, supplied for example on a roll 80; providing one or more application stations 8, the application stations 8 having one or more stationary sources 14 of material, a supply of patterned masks 12 for defining a pattern of material to be applied to the display substrate 10, means such as clamps 22 for attaching the discrete patterned masks to the substrate and means (such as powered rollers 82, 84) for transporting the display substrate 10 and the patterned masks 12 in registration past the one or more stationary sources 14 of material, and means 43 for delivering the masks one at a time to the transporting means and transporting the display substrate 10 past the one or more application stations 8. The direction of movement of the substrate 10 and mask 12 are shown by arrows A and B in FIG. 1 and in subsequent Figures.

Figure 10:
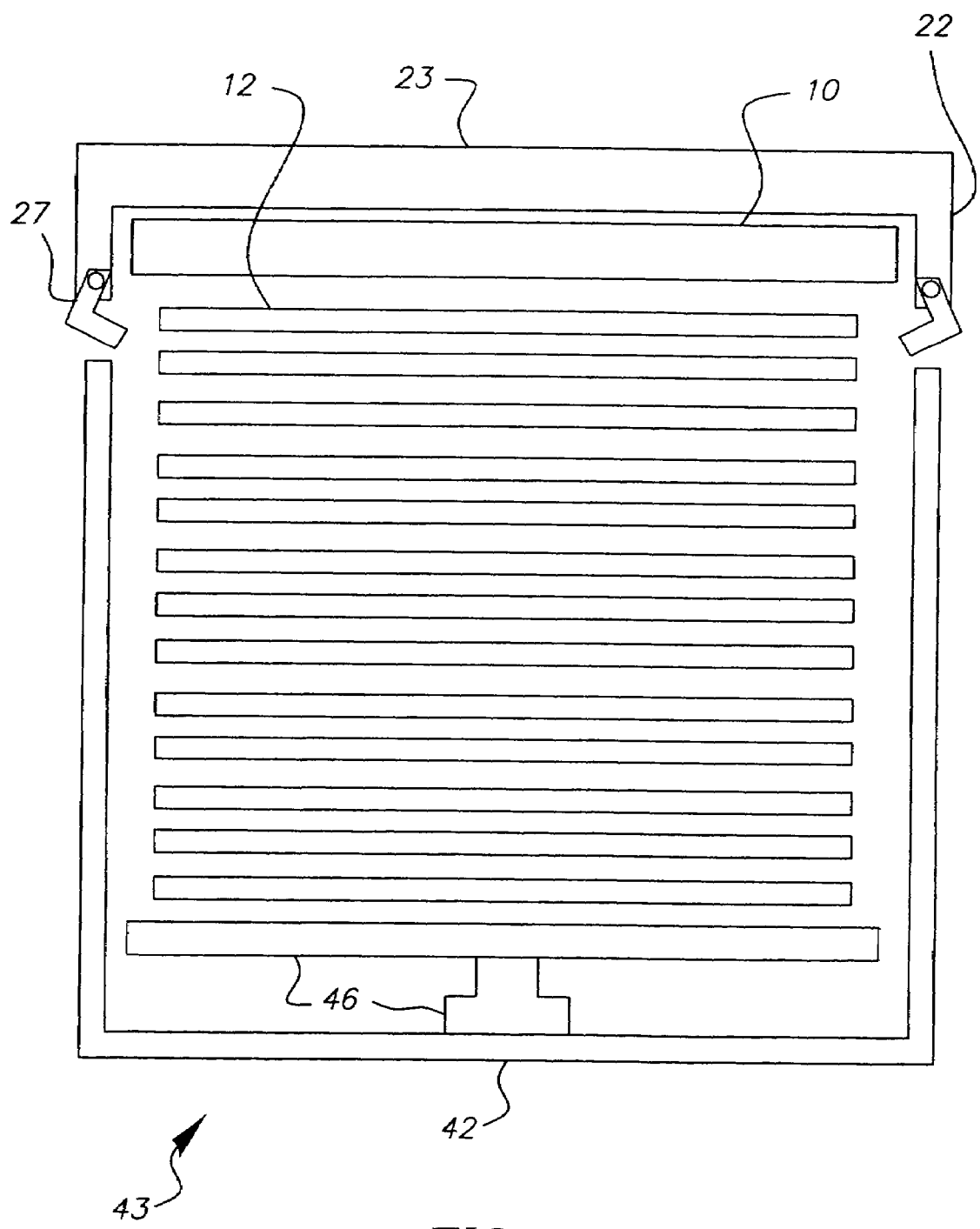
FIG. 10 is a schematic diagram of apparatus for attaching the masks to the substrate.

As shown in FIG. 10, container 42 holding a stack of masks 12 includes an elevator 46 for moving the masks, one at a time into engagement with substrate 10. The masks 12 are provided with electromechanical clamps 22 on two opposing edges. As the mask is urged into contact with the substrate 10, the electromechanical clamps 22 are actuated to grip the edges of the substrate 10.

The masks 12 are formed as discrete sheets that are supplied in a stacking container 42 and affixed to the substrate 10 as the masks are supplied from the container 42. After a mask 12 is transported with the substrate 10 past the source of materials, the mask is detached from the substrate 10 and received in a receiving container 42'. The masks 12 may be either flexible or rigid.

Figure 3:
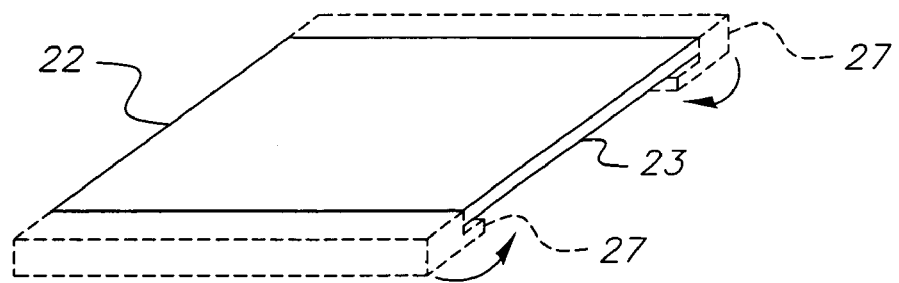
FIG. 3 is a perspective view of a clamp for attaching a mask to the substrate.

Referring to FIG. 3, the clamp 22 for removably attaching the mask to the substrate includes a body portion 23 and rotatable clips 27 mounted on two opposing edges of the body portion 23. The clamp 22 may function to hold a flexible mask in a plane, and may also assist in holding the substrate in a plane parallel to that of the mask. The rollers 82 and 84 for transporting the substrate 10 contact only the edges of the substrate and the clips 27.

Figure 4:
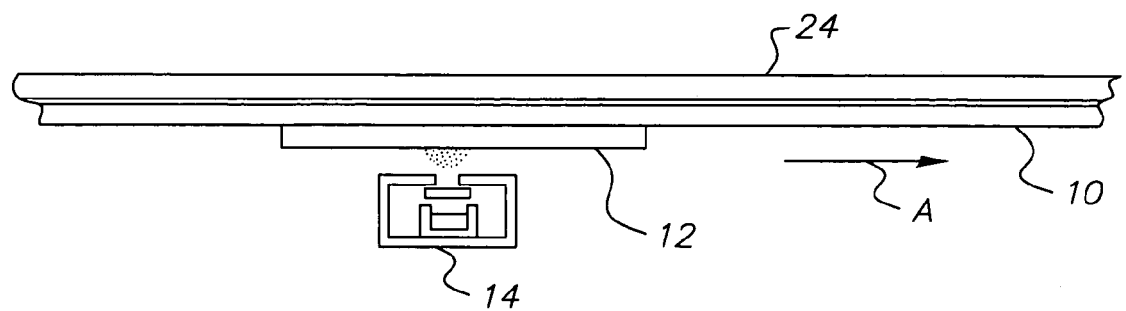
FIG. 4 is a schematic diagram of an alternative method of attaching a mask to a substrate using a magnet.
Figure 5:
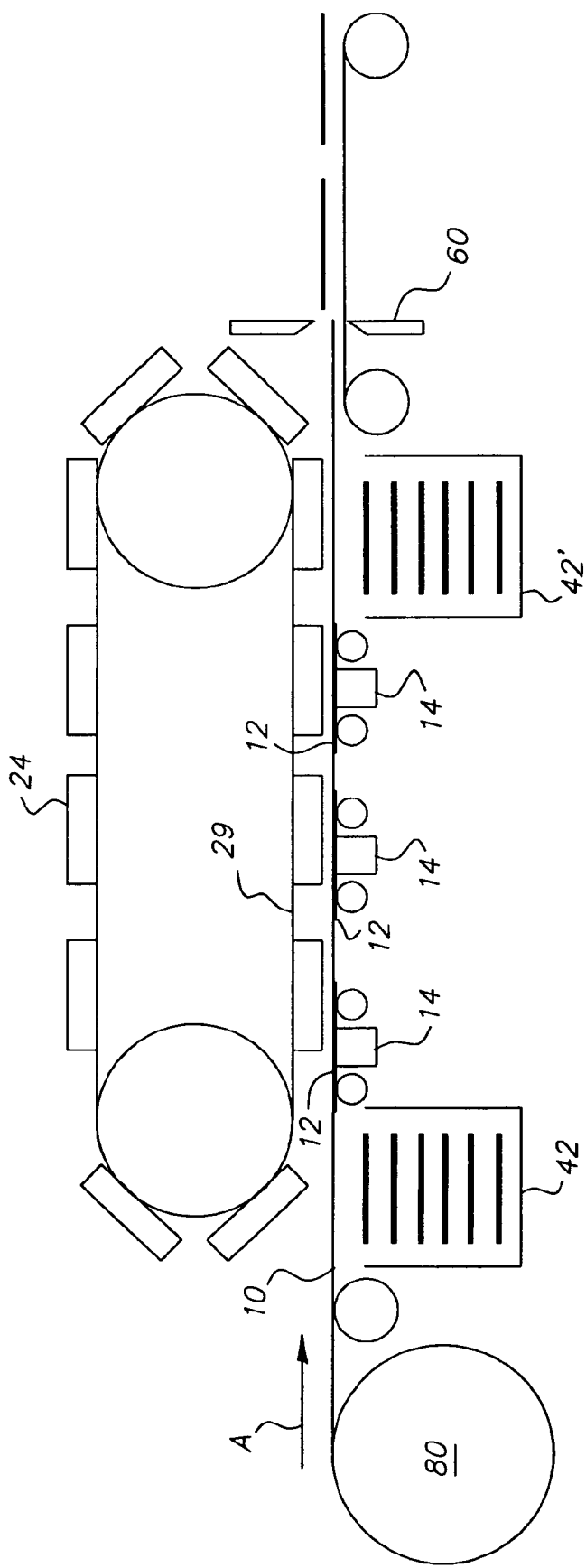
FIG. 5 is a schematic diagram of an alternative method of attaching a mask to a substrate using a magnet.

Referring to FIGS. 4 and 5, alternatively, a magnet 24 maybe employed to pull a mask 12 made of a magnetic material into contact with the substrate 10 and hold the mask in registration as it is transported with the substrate 10 past the application stations 8. As shown in FIG. 5, a series of electromagnets 24 may be transported along with the substrate 10 by a transport mechanism 29. The electromagnets 24 may be activated at the mask container 42 to pick up and attach a mask to the substrate. After the materials are applied, the electromagnet may be deactivated to release the masks 12 into receiving container 42'. The contact surface of electromagnets 24 may provide a reference surface for holding the substrate in a planar configuration and precisely locating the substrate and mask over the application stations.

Figure 6:
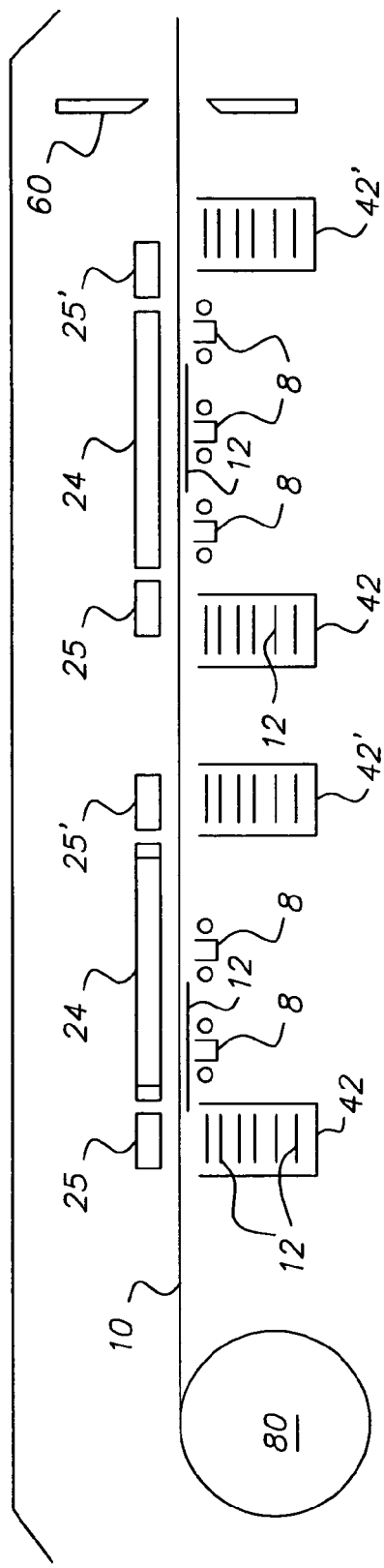
FIG. 6 is a schematic diagram of an alternative method of attaching a mask to a substrate using a magnet.

Referring to FIG. 6, the magnet 24 may be an extended stationary magnet. The stationary magnet may be provided with a low friction surface, such as Teflon™ so that the substrate may easily slide past the magnet surface. The magnet 24 extends between the containers 42 and 42' and includes separately activated portions 25 and 25' for attaching releasing the masks 12 from the substrate 10.

Referring back to FIG. 1, as the substrate 10 and mask 12 are transported in registration through the application station 8, the stationary source 14 applies material to the substrate 10 through the mask 12 to form a pattern on the substrate 10. A variety of materials and application methods may be used, for example, organic materials may be evaporated or sublimated onto the substrate, charged particles such as ions may be applied via a particle accelerator, chemicals may be deposited on the substrate as a vapor, or metals may be deposited by sputtering. Other materials such as polymeric materials may be applied by spraying, inkjet deposition, or offset printing. All of these techniques are known in the art and used to apply materials to substrates. Either or both the display substrate 10 and the patterned mask 12 may be flexible and made of, for example, plastic, flexible glass, thin metal or a composite of these materials. The masks 12 can be cleaned and recycled after use, or may be used once and discarded, or the mask materials may be recycled to form new masks.

Flat panel light sources include a plurality of layers of materials provided by a variety of process steps. As shown in FIG. 6, the present invention may be employed to apply a variety of materials in successive layers to a substrate through one or more masks. A series of application stations 8 may be employed to sequentially apply successive layers of material and/or treatments to a substrate. These layers may utilize the same masks at each station 8 as shown, or may utilize different masks at different application stations for a plurality of material and/or treatment applications.

Each application station 8 applies a particular material to form or modify a series of layers built up in successive planes on the substrate 10. After materials are deposited, a final deposition of encapsulating material may be applied to seal the materials on the substrate from the environment. A cutter 60 may then separate individual flat panel light sources from the continuous substrate.

Alternatively, successive stations may apply different materials in a single plane on the substrate. This is useful, for example, in depositing different light emitting materials for providing red, green, and blue light within a single layer and to form multiple layers for charge injection, charge transport, and light emission. Alternatively, successive stations may co-deposit materials in a plane.

Figure 7:
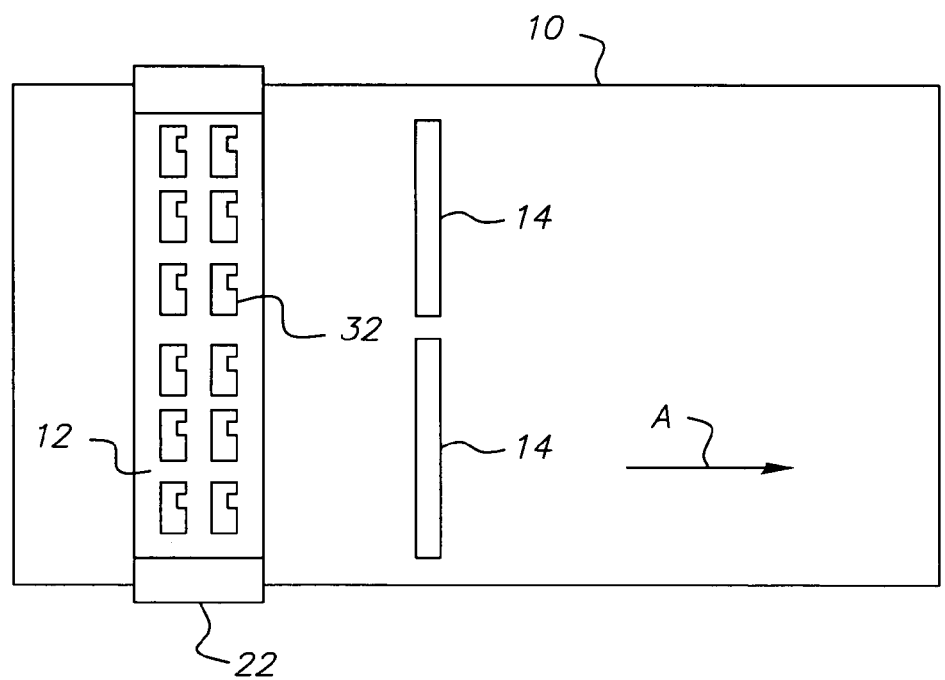
FIG. 7 is a schematic diagram of an alternative method of depositing materials on a substrate according to the present invention.

Referring to FIG. 7, according to a further alternative embodiment, material from a plurality of linear sources 14 may be provided in parallel across the width of a substrate 10. This arrangement is particularly useful for very wide substrates. Any of the application techniques described above may be employed in this embodiment and multiple application stations may also be used in parallel or sequentially to apply a variety of materials to a substrate through a plurality of patterned masks.

Figure 8:
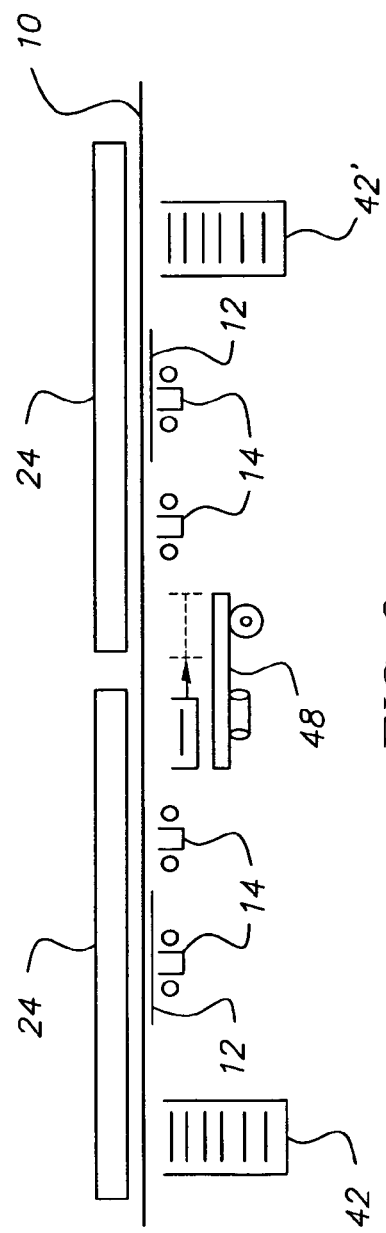
FIG. 8 is a schematic diagram of an alternative method of depositing materials on a substrate according to the present invention.
Figure 9:
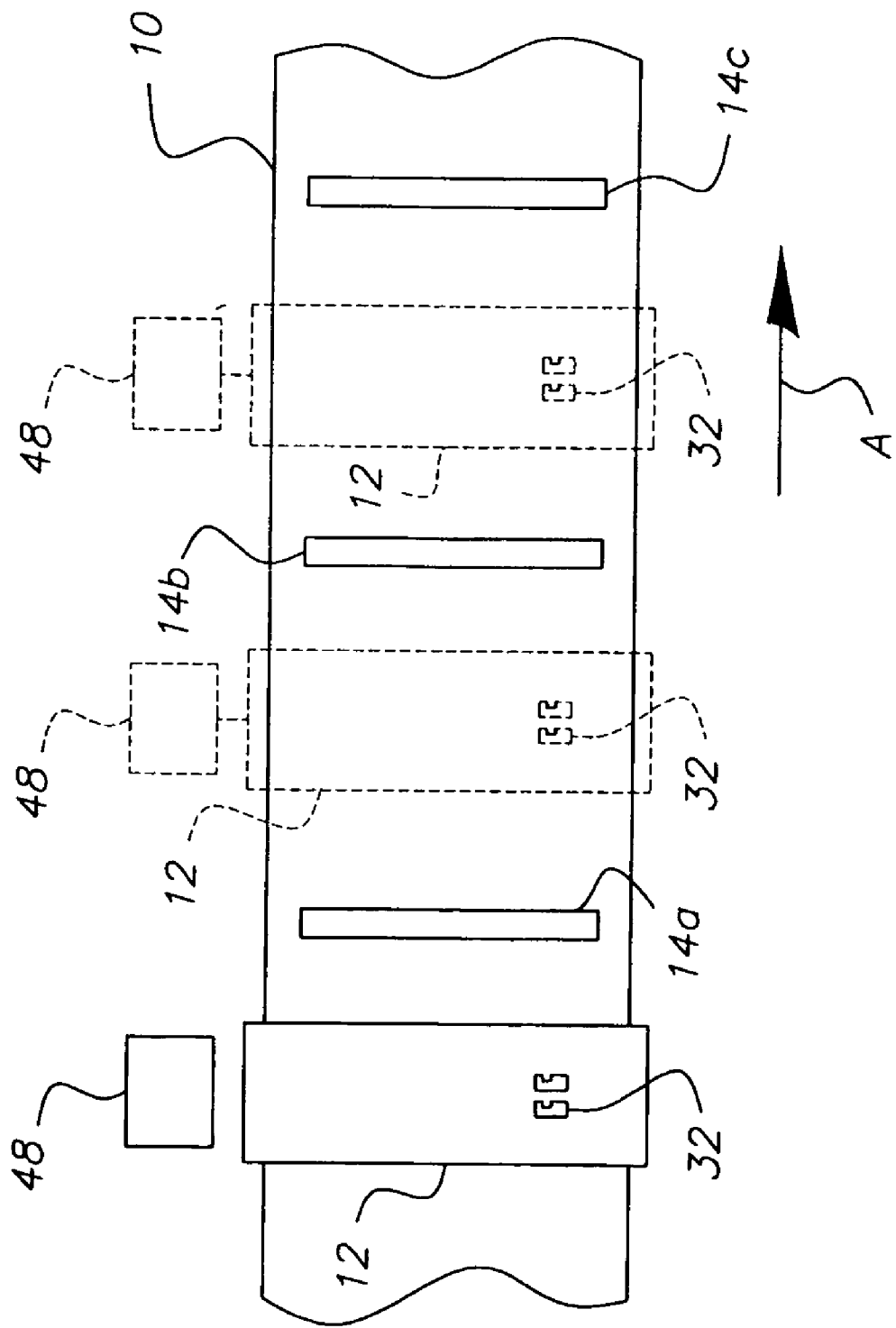
FIG. 9 is a schematic diagram of an alternative method of depositing materials on a substrate according to the present invention.

Alternatively, as shown in FIGS. 8 and 9, the mask 12 may be translated between sources 14 in a direction perpendicular to the direction of travel of the substrate, by a translation mechanism 48 that translates the mask when it is dropped by magnets 24. The mask 12 is replaced on the support after it is translated in a direction perpendicular to the long direction of the substrate. Materials are thereby applied in an identical pattern to different locations across the substrate 10. At a first source 14a, materials are applied while the mask pattern (shown for illustration purposes as a single mask opening 32) is located in a first position relative to the edge of the substrate 10. At a second source 14b, the mask has been shifted perpendicular to the direction of travel of the substrate 10 and materials are applied in the same pattern in second position offset from the first position. At a third source 14c (see FIG. 9), the mask has been further shifted and the materials are applied in the same pattern offset from the second position. This is particularly useful, for example, in applying repeated pixel patterns using different materials such as red, green, and blue light emitting materials in a strip pattern.

The linear source, materials, and evaporative techniques are all known in the art and described for example, in the VanSlyke reference cited above. The specification and construction of masks are also known in the art and may be made of, for example, plastic, glass, or metal such as Invar. Typically, masks of 50 microns are suitable and may be composed of conventional materials, such as Invar, with suitably small coefficients of thermal expansion.

The substrate 10 may be made of any suitable flexible material for flat panel displays that can be provided on a roll. Suitable substrate materials include flexible glass, plastic, and metal or laminates. The substrates may be modified as part of the manufacturing process, for example, with the application of vapor barriers.

Applied materials may include light emitting materials such as organic materials used in the manufacture of organic light emitting diode (OLEDs) displays or light sources. Other materials may include semiconductor materials, conductive materials such as metals, dielectrics, active species such as chemicals that interact with thin films of deposited materials, for example to provide means for removal of materials or to encapsulate or seal a layer.

The present invention may also be combined with other coating or deposition methods known in the art, for example curtain coating, to deposit or process other materials. In addition the invention may be used to selectively modify the substrate for adhesion, electrical properties, dopants and other desirable treatments. Existing methods for cutting, sealing, bonding, and packaging the substrate may also be employed.

The invention has been described in detail with particular reference to certain preferred embodiments thereof, but it will be understood that variations and modifications can be effected within the spirit and scope of the invention.

Parts List 8 application station
10 substrate
12 mask
14, a, b, c material source
22 clamps
23 body portion
24 magnet
25 magnet portion
25' magnet portion
27 clips
29 transport mechanism
32 mask opening
42 supply container
42' receiving container
43 delivery means
46 elevator
48 translation mechanism
60 cutter
80 supply roll
82, 84 powered roller

What is claimed is:

1. A method of applying patterned materials for manufacture of a flat panel light source, comprising:
    a) providing a flexible continuous substrate;
    b) providing one or more application stations, each application station having:
        i) one or more stationary sources of material to be patterned in manufacture of a flat panel light source,
        ii) a supply of discrete patterned masks for defining a pattern of material to be applied to the substrate,
        iii) means for delivering the masks one at a time into engagement with the substrate,
        iv) means for attaching the discrete patterned masks to the substrate, and;
        v) means for transporting the substrate and the patterned mask in registration past the one or more stationary sources of material, and
    c) transporting the substrate and the masks past the one or more application stations, and applying material from the one or more sources through the masks and onto the substrate to form a pattern of material in a flat panel light source.

2. The method claimed in claim 1, wherein the stationary source is a linear source arranged orthogonal to the direction of transport.

3. The method claimed in claim 1, wherein the one or more stationary sources include two stationary sources that are arranged in parallel with respect to the direction of transport.

4. The method claimed in claim 1, wherein the one or more application stations include two application stations that are arranged in parallel with respect to the direction of transport.

5. The method claimed in claim 1, wherein the light source is an OLED light source.

6. The method claimed in claim 1, wherein the materials are light emissive materials, semiconductor materials, conductors, or dielectrics.

7. The method claimed in claim 1, wherein the mask is a rigid sheet.

8. The method claimed in claim 1, wherein the mask is a flexible sheet.

9. The method claimed in claim 1, further comprising the steps of cleaning material from the masks and reusing the masks.

10. A flat panel light source made by the method of claim 1.

11. The method claimed in claim 1, wherein the masks are discarded after a single use.

12. The method claimed in claim 1, wherein the substrate is a web mounted on a supply roller located on one side of the application station(s).

13. The method claimed in claim 1, further comprising the step of cutting the substrate into sheets after deposition of the material.

14. The method claimed in claim 1, wherein the supply of discrete patterned masks comprises a stack of masks.

15. The method claimed in claim 1, further comprising the step of shifting the mask relative to the substrate in a direction perpendicular to the direction of transport between sources, and applying material through the mask in identical patterns to different locations across the substrate.

16. The method claimed in claim 1, wherein the mask is a magnetic material and the means for attaching the mask to the substrate is a magnet located on an opposite side of the substrate from the mask.

17. The method claimed in claim 16, wherein the means for attaching the mask includes a reference surface for locating the substrate with respect to the source of material.

18. The method claimed in claim 16, wherein the magnet is a fixed magnet.

19. The method claimed in claim 16, wherein the magnet is conveyed along with the substrate.

20. The method claimed in claim 1, wherein the means for attaching the mask to the substrate is a mechanical clamp.

21. The method claimed in claim 20, wherein the mechanical clamp includes means for maintaining the substrate in a planar configuration.

22. The method claimed in claim 20, wherein the mechanical clamp includes a rectangular frame having clamps on two opposing edges.

23. The method claimed in claim 1, wherein the one or more application stations include two application stations, and further comprising the step of displacing the mask in a direction orthogonal to the direction of transport of the substrate between application stations.

* * * * *